(12) United States Patent
Kakiuchi

(10) Patent No.: US 10,978,633 B2
(45) Date of Patent: Apr. 13, 2021

(54) ACTUATOR DEVICE HAVING A TRACE WITH A BASE SECTION COUPLED TO TERMINALS

(71) Applicant: BROTHER KOGYO KABUSHIKI KAISHA, Nagoya (JP)

(72) Inventor: Toru Kakiuchi, Aichi-ken (JP)

(73) Assignee: BROTHER KOGYO KABUSHIKI KAISHA, Nagoya (JP)

(*) Notice: Subject to any disclaimer, the term of this patent is extended or adjusted under 35 U.S.C. 154(b) by 503 days.

(21) Appl. No.: 15/915,393

(22) Filed: Mar. 8, 2018

(65) Prior Publication Data
US 2018/0287044 A1 Oct. 4, 2018

(30) Foreign Application Priority Data

Mar. 29, 2017 (JP) .............................. JP2017-065592

(51) Int. Cl.
| | | |
|---|---|---|
| *H01L 41/047* | (2006.01) | |
| *H01L 41/09* | (2006.01) | |
| *B41J 2/14* | (2006.01) | |
| *B41J 2/045* | (2006.01) | |
| *H01L 41/053* | (2006.01) | |
| *B41J 2/04* | (2006.01) | |
| *H01L 41/187* | (2006.01) | |

(52) U.S. Cl.
CPC .......... *H01L 41/0475* (2013.01); *B41J 2/045* (2013.01); *B41J 2/14201* (2013.01); *B41J 2/14233* (2013.01); *H01L 41/0973* (2013.01); *B41J 2002/043* (2013.01); *B41J 2002/14491* (2013.01); *H01L 41/0533* (2013.01); *H01L 41/1876* (2013.01)

(58) Field of Classification Search
CPC .... B41J 2/14233; B41J 2/14201; B41J 2/045; B41J 2002/14491; B41J 2002/043; H01L 41/0475; H01L 41/0973; H01L 41/0533; H01L 41/1876
See application file for complete search history.

(56) References Cited

U.S. PATENT DOCUMENTS

| | | | | |
|---|---|---|---|---|
| 5,808,834 A | * | 9/1998 | Jurgenson | ............ G11B 5/4853 360/234.5 |
| 6,803,703 B2 | * | 10/2004 | Junhua | ................. B41J 2/14233 310/328 |
| 2012/0086759 A1 | | 4/2012 | Takada | |
| 2015/0021411 A1 | | 1/2015 | Okui et al. | |
| 2018/0226560 A1 | * | 8/2018 | Yonemura | .............. B41J 2/1632 |

FOREIGN PATENT DOCUMENTS

| | | |
|---|---|---|
| JP | 2012-81639 A | 4/2012 |
| JP | 2015-20294 A | 2/2015 |

* cited by examiner

*Primary Examiner* — Emily P Pham
(74) *Attorney, Agent, or Firm* — Merchant & Gould P.C.

(57) ABSTRACT

An actuator device is provided. The actuator device includes: a first substrate including a contact; and a second substrate including a trace electrically connected to the contact. A portion of the second substrate is laminated to the first substrate in a first direction. The portion of the second substrate is adhered to the first substrate. A portion of the trace overlaps the contact in the first direction. A portion of the trace includes a plurality of terminals and a base section. The plurality of terminals are separated from each other. The base section is coupled to the plurality of terminals.

20 Claims, 12 Drawing Sheets

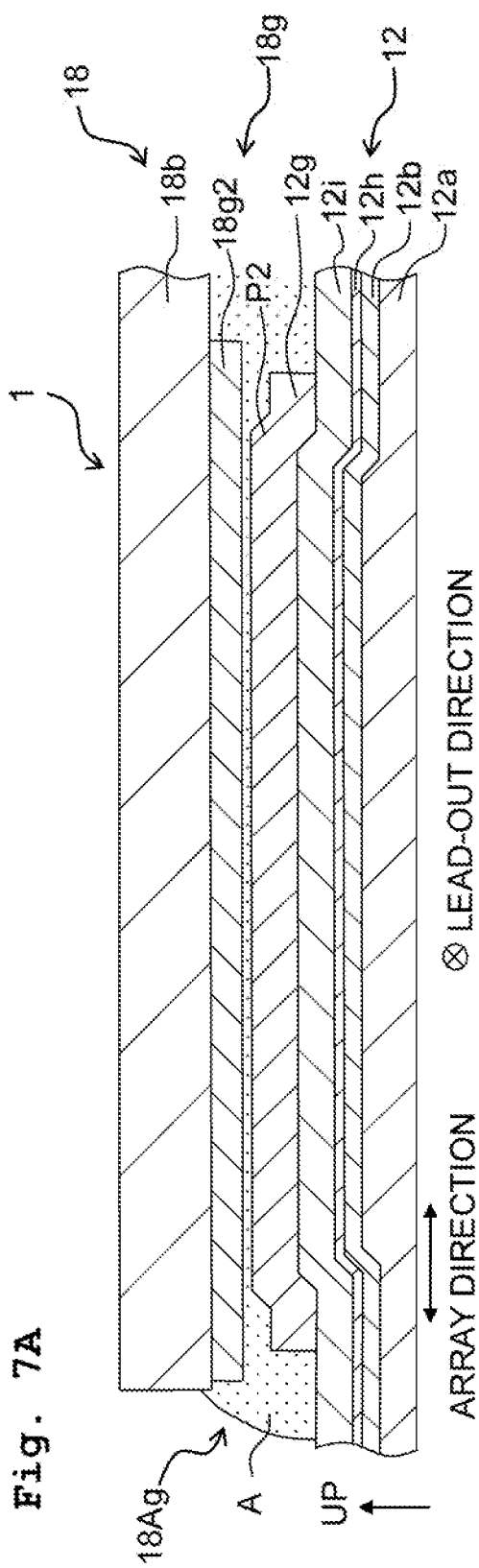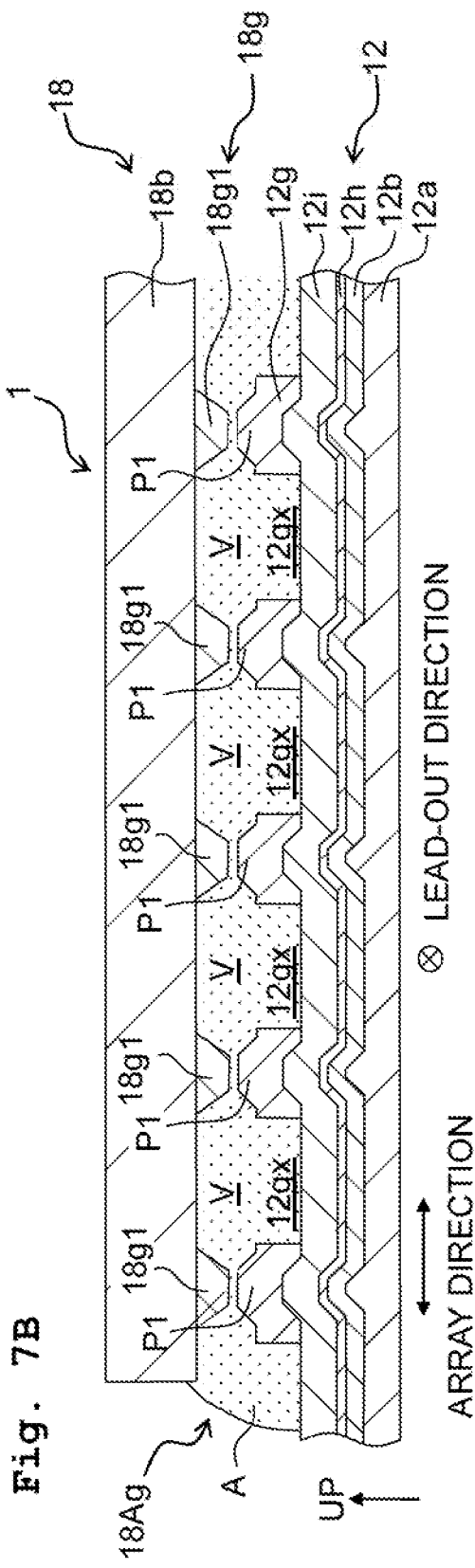

ACTUATOR DEVICE HAVING A TRACE WITH A BASE SECTION COUPLED TO TERMINALS

CROSS REFERENCE TO RELATED APPLICATION

The present application claims priority from Japanese Patent Application No. 2017-065592 filed on Mar. 29, 2017, the disclosure of which is incorporated herein by reference in its entirety.

BACKGROUND

Field of the Invention

The present teaching relates to an actuator device that includes a substrate having a contact and another substrate having a trace electrically connected to the contact.

Description of the Related Art

Regarding an actuator, there is known a technology in which a plurality of terminals separated from each other are provided in an adhesion region of a contact and a trace, of the trace of a trace-substrate. For example, a plurality of terminals being provided in a trace terminal section of a trace-member, is known. In this case, an adhesive agent penetrates between the plurality of terminals, whereby adhesive strength of an actuator substrate and the trace-substrate improves.

SUMMARY

However, in the above-mentioned configuration, when variation occurs in contact resistance in the plurality of terminals, current concentrates in one of the plurality of terminals whose contact resistance is small. The concentration of the current could lead to large evolution of heat at the one of the plurality of terminals, and might cause a disconnection due to the heat.

An object of the present teaching is to provide an actuator device capable of preventing disconnection of a terminal and capable of improving adhesive strength of an actuator substrate and a trace-substrate.

In accordance with an aspect of the present teaching, there is provided an actuator device including: a first substrate including a contact; and a second substrate including a trace electrically connected to the contact. A portion of the second substrate is laminated to the first substrate in a first direction. The portion of the second substrate is adhered to the first substrate. A portion of the trace overlaps the contact in the first direction. A portion of the trace includes a plurality of terminals and a base section. The plurality of terminals are separated from each other. The base section is coupled to the plurality of terminals.

BRIEF DESCRIPTION OF THE DRAWINGS

FIG. 7A is a cross-sectional view taken along the line VIIA-VIIA of FIG. 6; and FIG. 7B is a cross-sectional view taken along the line VIIB-VIIB of FIG. 6.

DESCRIPTION OF THE EMBODIMENTS

First Embodiment

Figure 1:
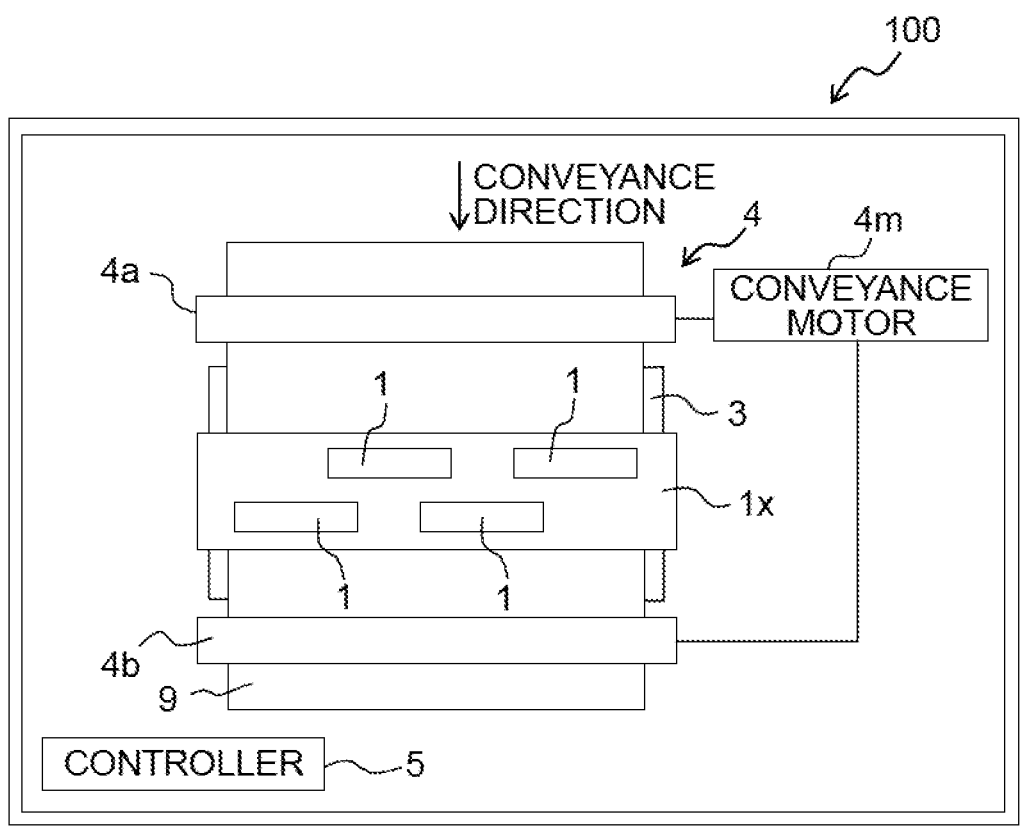
FIG. 1 is a schematic plan view of a printer 100 including a head 1 according to a first embodiment of the present teaching.

First, an overall configuration of a printer 100 that includes a head unit 1x including a head 1 according to a first embodiment of the present teaching will be described with reference to FIG. 1. The head 1 corresponds to an actuator device of the present teaching. The printer 100 includes a platen 3, a conveyance mechanism 4, and a controller 5, in addition to the head unit 1x.

The head unit 1x is a line type head unit (that is, a system where ink is discharged onto a sheet 9 in a state that a position of the head unit 1x is fixed), and is long in a direction orthogonal to a conveyance direction. The head unit 1x includes four of the heads 1 disposed in a zigzag manner along the direction orthogonal to the conveyance direction. The four head units 1 have the same structure as each other. Each of the heads 1 discharges ink from a plurality of nozzles 11n (refer to FIGS. 2 and 3).

The platen 3 is disposed below the head unit 1x. Ink is discharged from each of the heads 1 onto the sheet 9 supported by the platen 3.

The conveyance mechanism 4 has two roller pairs 4a, 4b that are disposed sandwiching the platen 3 in the conveyance direction. Drive of a conveyance motor 4m causes two rollers configuring each of the roller pairs 4a, 4b to rotate in reverse directions to each other in a state of gripping the sheet 9. As a result, the sheet 9 is conveyed in the conveyance direction.

The controller 5 controls the likes of the four heads 1 and the conveyance motor 4m such that an image is recorded on the sheet 9, based on a recording instruction inputted from an external apparatus such as a PC.

Next, a configuration of the head 1 will be described with reference to FIGS. 2 to 4. The head 1 has a flow path substrate 11, an actuator 12, and a COF 18. The flow path substrate 11 corresponds to an actuator substrate of the present teaching, and the COF 18 corresponds to a trace-substrate of the present teaching.

Figure 2:
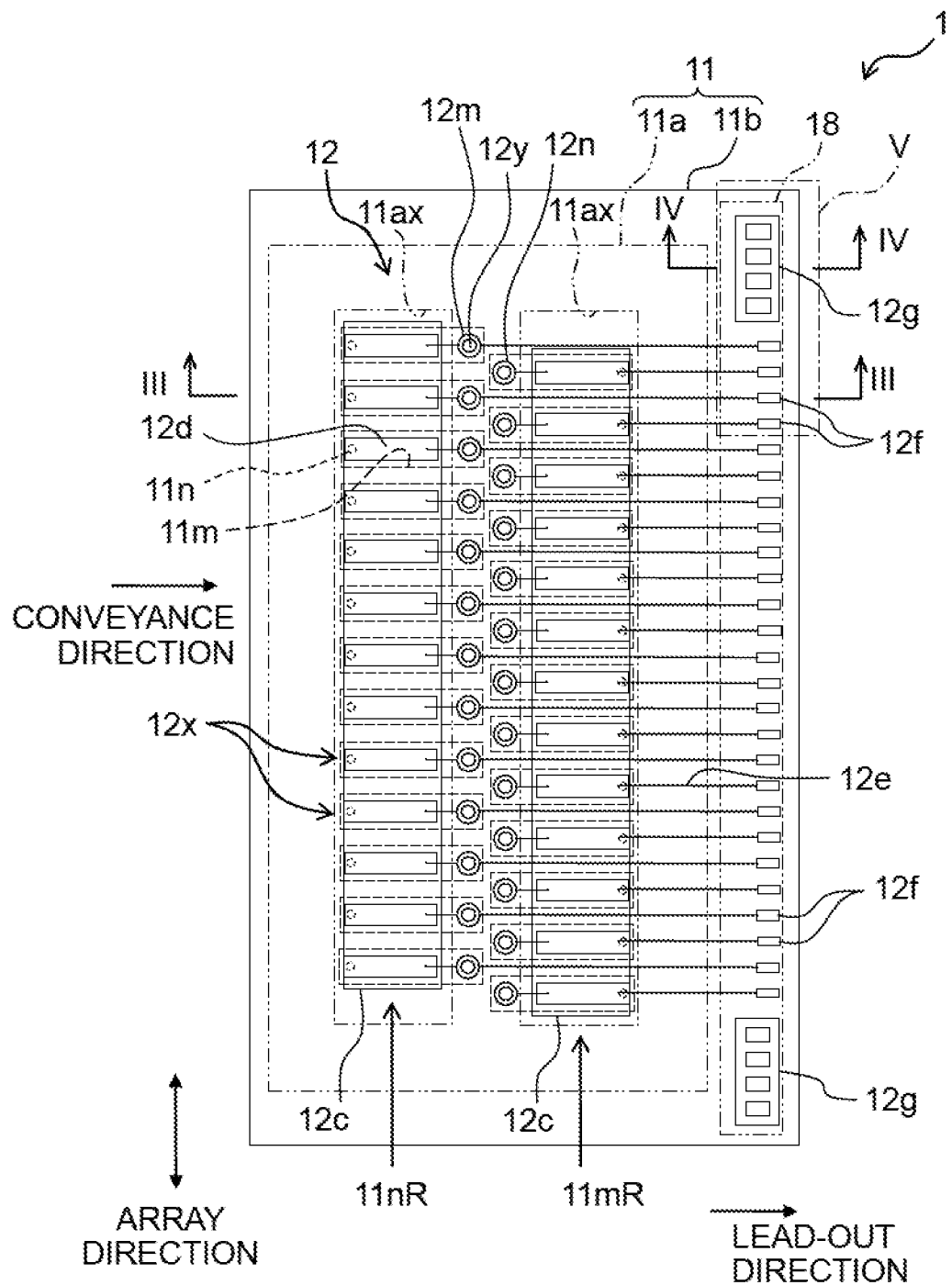
FIG. 2 is a plan view of the head 1.
Figure 3:
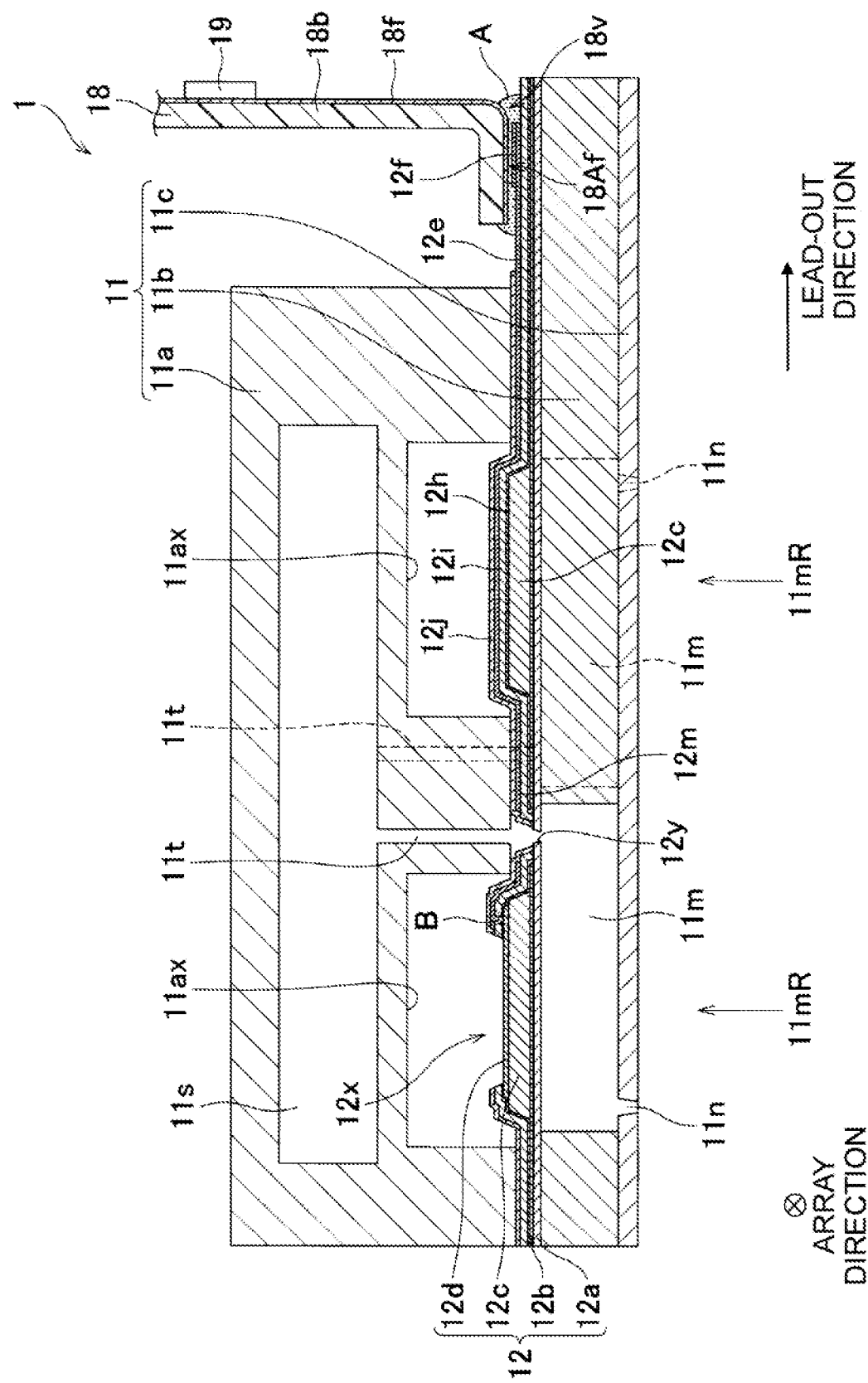
FIG. 3 is a cross-sectional view taken along the line of FIG. 2.

As depicted in FIG. 3, the flow path substrate 11 has a reservoir member 11a, a pressure chamber plate 11b, and a nozzle plate 11c, and is configured having these adhered to each other. As depicted in FIGS. 2 and 3, the flow path substrate 11 has formed therein a reservoir 11s, a plurality of pressure chambers 11m, and a plurality of the nozzles 11n.

The pressure chamber plate 11b is configured from a silicon single crystal substrate, and, as depicted in FIG. 3, is formed penetrated by the plurality of pressure chambers 11*m*. As depicted in FIG. 2, the plurality of pressure chambers 11*m* are arranged so as to configure two pressure chamber columns 11*m*R. The plurality of pressure chambers 11*m* configuring each of the pressure chamber columns 11*m*R are arranged equally spaced in an array direction (a direction orthogonal to the conveyance direction). The two pressure chamber columns 11*m*R are aligned in a direction orthogonal to the array direction (a direction parallel to the conveyance direction). The plurality of pressure chambers 11*m* are arranged in a zigzag manner such that their positions in the array direction respectively differ.

As depicted in FIG. 3, the nozzle plate 11*c* is formed penetrated by the plurality of nozzles 11*n* that are respectively communicating with the plurality of pressure chambers 11*m*, and is adhered to a lower surface of the pressure chamber plate 11*b*. As depicted in FIG. 2, the plurality of nozzles 11*n*, similarly to the plurality of pressure chambers 11*m*, are arranged in two columns and are arranged in a zigzag manner such that their positions in the array direction respectively differ.

As depicted in FIG. 3, the actuator 12 is disposed on an upper surface of the pressure chamber plate 11*b*. The actuator 12 includes, in order from below, a vibrating plate 12*a*, a common electrode 12*b*, a pair of piezoelectric bodies 12*c*, and a plurality of individual electrodes 12*d*.

The vibrating plate 12*a* is a silicon dioxide film formed by oxidizing a surface of the silicon single crystal substrate configuring the pressure chamber plate 11*b*, and is formed on substantially the whole of the upper surface of the pressure chamber plate 11*b*. The common electrode 12*b* is an electrode common to the plurality of pressure chambers 11*m*, and is formed on substantially the whole of an upper surface of the vibrating plate 12*a*. The pair of piezoelectric bodies 12*c* are configured from a piezoelectric material such as lead zirconate titanate (PZT), and, on an upper surface of the common electrode 12*b*, each extend in the array direction and cover the plurality of pressure chambers 11*m* configuring each of the pressure chamber columns 11*m*R. The plurality of individual electrodes 12*d* are disposed in positions facing respective ones of the plurality of pressure chambers 11*m*, on an upper surface of each of the piezoelectric bodies 12*c*.

A portion sandwiched by the individual electrode 12*d* and the common electrode 12*b* in the piezoelectric body 12*c* functions as an active section 12*x* capable of deforming based on application of a voltage to the individual electrode 12*d*. That is, the actuator 12 has a plurality of active sections 12*x* facing the pressure chambers 11*m*. Due to drive of the active section 12*x* facing the pressure chamber 11*m* (that is, due to the active section 12*x* being deformed (for example, convexly toward the pressure chamber 11*m*) based on application of the voltage to the individual electrode 12*d*), capacity of the pressure chamber 11*m* changes, a pressure is applied to ink in the pressure chamber 11*m*, and ink is discharged from the nozzle 11*n*.

The actuator 12 is further provided with a piezoelectric body protective film 12*h*, an interlayer insulating film 12*i*, a plurality of traces 12*e*, and a trace protective film 12*j*. The piezoelectric body protective film 12*h* has a function of preventing infiltration into the piezoelectric body 12*c* of moisture in the air, and covers the pair of piezoelectric bodies 12*c*. The piezoelectric body protective film 12*h* is configured from the likes of aluminum oxide (alumina: $Al_2O_3$), for example. Note that in order to prevent drive of the active section 12*x* being hindered, the piezoelectric body protective film 12*h* covers only a peripheral edge section of each of the individual electrodes 12*d*, and a central section of each of the individual electrodes 12*d* is exposed from the piezoelectric body protective film 12*h*.

The interlayer insulating film 12*i* has a function of increasing insulation between the trace 12*e* and the common electrode 12*b*, and is provided between the piezoelectric body protective film 12*h* and the trace 12*e*. The interlayer insulating film 12*i* is configured from the likes of silicon dioxide ($SiO_2$), for example.

The plurality of traces 12*e* are formed on an upper surface of the interlayer insulating film 12*i*, and, by penetrating into through holes B that penetrate the piezoelectric body protective film 12*h* and the interlayer insulating film 12*i*, are electrically connected to respective ones of the plurality of individual electrodes 12*d*.

As depicted in FIG. 2, the plurality of traces 12*e* are each led out to a downstream side in the conveyance direction (a lead-out direction that the COF 18 is led out from the flow path substrate 11) and each extend to a portion not covered by the reservoir member 11*a* in the pressure chamber plate 11*b*. An individual contact 12*f* is formed at a downstream end in the lead-out direction of each of the traces 12*e*. The plurality of individual contacts 12*f* have the same shape and size as each other, and are arranged equally spaced in the array direction.

A pair of common contacts 12*g* are further provided on the upper surface of the interlayer insulating film 12*i* so as to sandwich the plurality of individual contacts 12*f* in the array direction. The pair of common contacts 12*g* penetrate into through holes C (refer to FIG. 4) penetrating the interlayer insulating film 12*i* and the piezoelectric body protective film 12*h*, and are thereby electrically connected to the common electrode 12*b*. A width (a length in the array direction) of each of the common contacts 12*g* is larger than a width of each of the individual contacts 12*f*, and an area of each of the common contacts 12*g* is larger than an area of each of the individual contacts 12*f*.

The trace protective film 12*j* has a function of increasing insulation between the plurality of traces 12*e*, and is provided on the upper surface of the interlayer insulating film 12*i* so as to cover the plurality of traces 12*e*. The trace protective film 12*j* is configured from the likes of silicon nitride (SiNx), for example. Note that the contacts 12*f*, 12*g* are not covered by the trace protective film 12*j*.

As depicted in FIG. 3, the reservoir member 11*a* has the following formed therein, namely: the reservoir 11*s*; a plurality of communicating flow paths 11*t* that communicate the reservoir 11*s* and respective ones of the plurality of pressure chambers 11*m*; and a pair of recessed sections 11*ax* each extending in the array direction. The reservoir member 11*a* is adhered, via the actuator 12, to the upper surface of the pressure chamber plate 11*b*, such that the pair of piezoelectric bodies 12*c* are respectively housed within the pair of recessed sections 11*ax*. A plurality of through holes 12*y* are respectively formed in portions corresponding to the plurality of communicating flow paths 11*t* in the actuator 12.

The reservoir 11*s* communicates, via a tube or the like, with a tank that stores ink. The ink in the tank is supplied to the reservoir 11*s* by drive of a pump (illustration of which is omitted), and passes through the plurality of communicating flow paths 11*t* and the plurality of through holes 12*y* to be supplied to the plurality of pressure chambers 11*m* configuring each of the pressure chamber columns 11*m*R.

As depicted in FIG. 2, ring electrodes 12*m*, 12*n* are provided at a peripheral edge of each of the through holes 12*y*. The ring electrode 12*m* surrounds each of the through holes 12*y* corresponding to the pressure chamber column 11mR on the left side of the paper surface of FIG. 2, and is electrically connected to the trace 12e connected to the individual electrode 12d facing each of the pressure chambers 11m configuring said pressure chamber column 11mR. On the other hand, the ring electrode 12n surrounds each of the through holes 12y corresponding to the pressure chamber column 11mR on the right side of the paper surface of FIG. 2, and is electrically connected to the trace 12e connected to the individual electrode 12d facing each of the pressure chambers 11m configuring said pressure chamber column 11mR.

Figure 4:
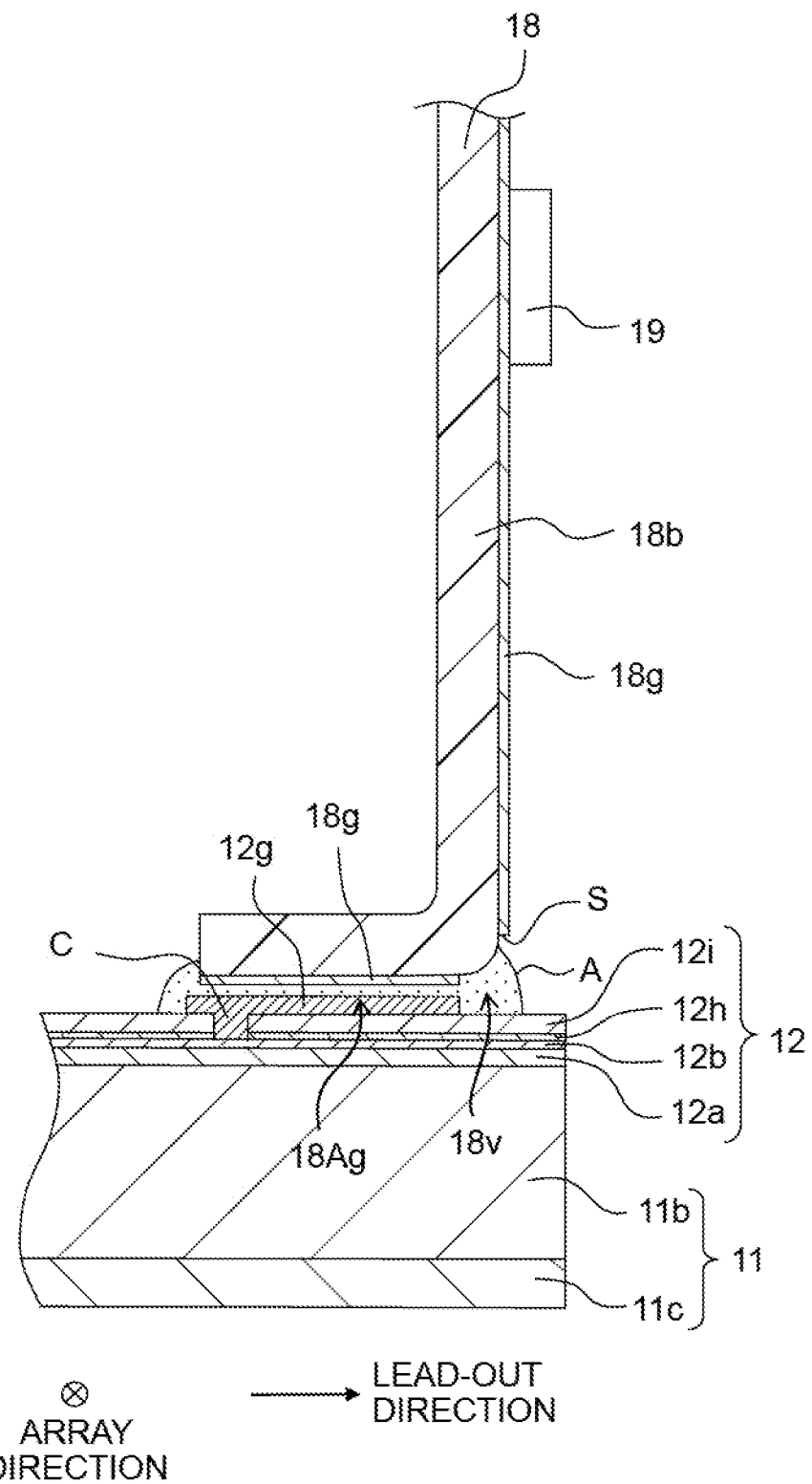
FIG. 4 is a cross-sectional view taken along the line IV-IV of FIG. 2.

As depicted in FIGS. 3 and 4, the COF 18 includes: a sheet 18b having insulating properties that is configured from a polyimide or the like; a plurality of individual traces 18f electrically connected to respective ones of the plurality of individual contacts 12f; and a pair of common traces 18g electrically connected to respective ones of the pair of common contacts 12g. The individual trace 18f and the common trace 18g are provided on a surface of the sheet 18b.

One end of the COF 18 is adhered to the flow path substrate 11 via an adhesive agent (in the present embodiment, an ACF (Anisotropic Conductive Film)) A, in a state where the individual trace 18f and the common trace 18g face respective ones of the individual contact 12f and the common contact 12g. The COF 18 has a bent section 18v that has been bent, at a downstream end in the lead-out direction of adhesion regions 18Af, 18Ag of the contacts 12f, 12g and the traces 18f, 18g, and the COF 18 extends upwardly from the bent section 18v. The other end of the COF 18 is located above the bent section 18v, and is electrically connected to the controller 5 (refer to FIG. 1).

The traces 18f, 18g are provided in the bent section 18v. A slit S is formed in a portion corresponding to the bent section 18v of the common trace 18g, of the traces 18f, 18g, and there is a configuration enabling the bent section 18v to be easily formed.

A driver IC 19 is mounted between the one end and the other end of the COF 18. The driver IC 19 is electrically connected to, respectively, the contacts 12f, 12g and the controller 5, via the traces 18f, 18g. The driver IC 19, based on a signal from the controller 5, generates a drive signal for driving the active section 12x, and supplies said drive signal to each of the individual electrodes 12d. A potential of the common electrode 12b is maintained at a ground potential.

Next, configurations of the traces 18f, 18g of the COF 18, and so on, will be specifically described with reference to FIGS. 5 to 7B.

Figure 5:
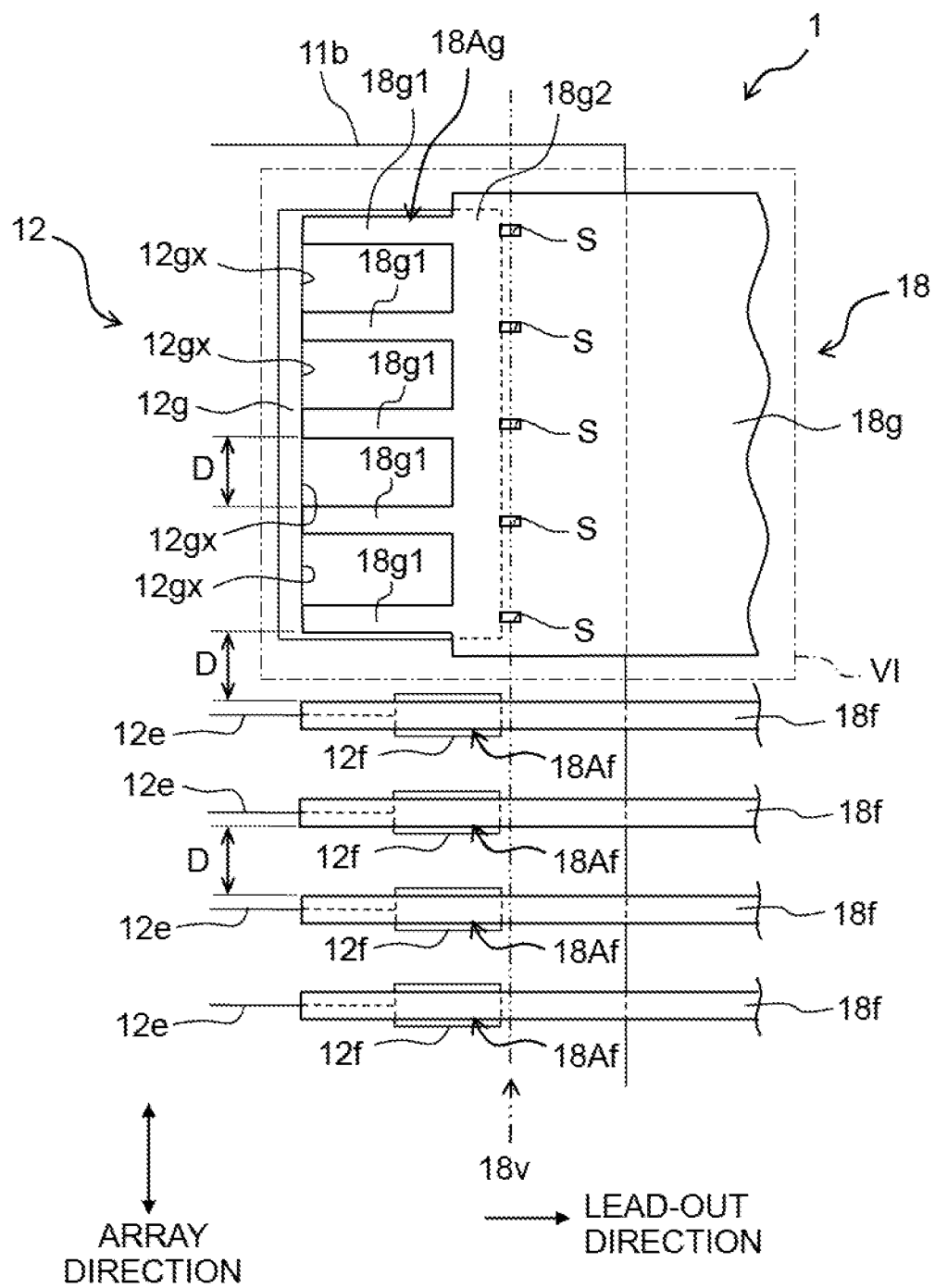
FIG. 5 is a view depicting a connection configuration of contacts 12f, 12g of an actuator 12 and traces 18f, 18g of a COF 18 in a region V of FIG. 2 (a development view of the COF 18).

As depicted in FIG. 5, the plurality of individual traces 18f have the same shape and size as each other, and are arranged equally spaced (with a spacing D) in the array direction. Each of the individual traces 18f has a slightly smaller width than each of the individual contacts 12f, is disposed in substantially a center of each of the individual contacts 12f, and extends to an upstream side in the lead-out direction from each of the individual contacts 12f.

The pair of common traces 18g, similarly to the pair of common contacts 12g depicted in FIG. 2, are provided in positions sandwiching the plurality of individual traces 18f in the array direction. As depicted in FIG. 5, a width of each of the common traces 18g is larger than a width of each of the individual traces 18f, and an area of each of the common traces 18g is larger than an area of each of the individual traces 18f. The adhesion region 18Ag of each of the common traces 18g and each of the common contacts 12g has a larger area than the adhesion region 18Af of each of the individual traces 18f and each of the individual contacts 12f.

Each of the common traces 18g has the following in the adhesion region 18Ag, namely: five terminals 18g1 that are separated from each other; and a base section 18g2 that is coupled to the five terminals 18g1. In other words, a portion of the adhesion region 18Ag in each of the common traces 18g is comb tooth shaped, and has: a base section 18g2; and five terminals 18g1 that project to an upstream side in the lead-out direction from the base section 18g2. The five terminals 18g1 are provided most on an upstream side in the lead-out direction in the adhesion region 18Ag, and the base section 18g2 is provided on a downstream side in the lead-out direction with respect to the five terminals 18g1, most on a downstream side in the lead-out direction in the adhesion region 18Ag.

The five terminals 18g1 are arranged equally spaced (with the spacing D) separated from each other in the array direction. The spacing in the array direction of fellow terminals 18g1 and the spacing in the array direction of fellow individual traces 18f are the same as each other. Furthermore, a width of each of the terminals 18g1 is the same as the width of each of the individual traces 18f, and the terminals 18g1 and the individual traces 18f are arranged in the array direction equally spaced (with the spacing D).

The slits S (refer to FIG. 4) provided in the portion corresponding to the bent section 18v of the common trace 18g are formed in the base section 18g2 and each extend to a downstream side in the lead-out direction from the base section 18g2. The five slits S face respective ones of the five terminals 18g1 in the lead-out direction, and are disposed equally spaced in the array direction.

Figure 6:
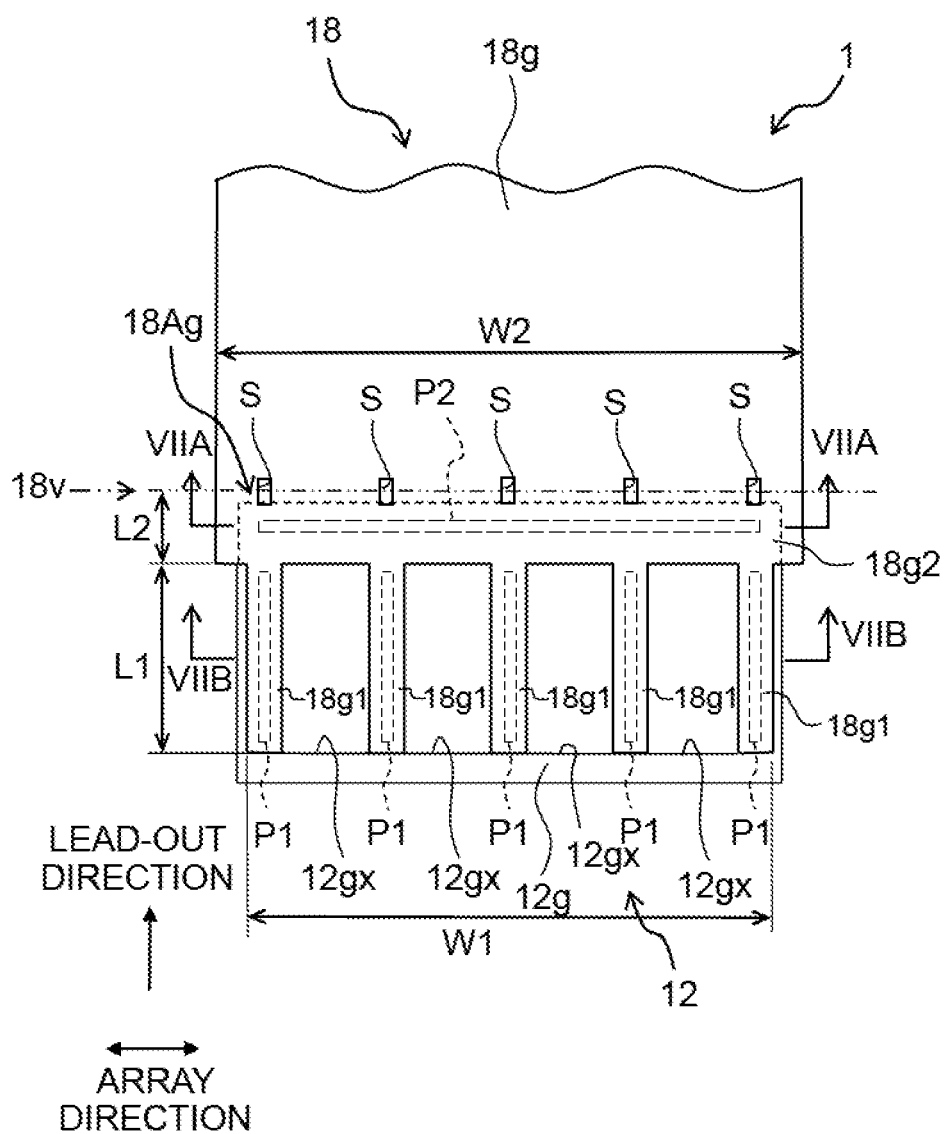
FIG. 6 is a view depicting a region VI of FIG. 5.

As depicted in FIG. 6, a width W1 of the five terminals 18g1 is longer than a length L1 in the lead-out direction of each of the terminals 18g1 (W1>L1). A length L2 in the lead-out direction of the base section 18g2 is shorter than the length L1 in the lead-out direction of each of the terminals 18g1 (L1>L2). A width W2 of the base section 18g2 is longer than the width W1 of the five terminals 18g1 (W2>W1).

In each of the common contacts 12g, a gap 12gx is provided in a portion facing a space between the terminals 18g1. In planar view, the gap 12gx is rectangular and its shape and size substantially match those of the space between the terminals 18g1. As depicted in FIG. 7B, each of the common traces 18g is disposed on each of the common contacts 12g such that the gap 12gx and a space V between the terminals 18g1 are facing. By the adhesive agent A being filled into the space V and the gap 12gx and being disposed in a periphery of the common trace 18g and the common contact 12g, each of the common traces 18g and each of the common contacts 12g are adhered to each other.

In addition, as depicted in FIGS. 6, 7A and 7B, each of the common contacts 12g has in the adhesion region 18Ag protrusions P1, P2 that project in a direction of increasing closeness to the common trace 18g (that is, upwardly). The protrusion P1 is provided in a position facing each of the terminals 18g1, and extends along the lead-out direction. The protrusion P2 is provided in a position facing the base section 18g2, and extends along the array direction. The protrusion P1 provided in the position facing each of the terminals 18g1 and the protrusion P2 provided in the position facing the base section 18g2 are separated from each other.

Note that as depicted in FIGS. 7A and 7B, the protrusions P1, P2 are formed by portions corresponding to the protrusions P1, P2 being configured in a projecting shape in the vibrating plate 12a, and the common electrode 12b, the piezoelectric body protective film 12h, the interlayer insulating film 12*i*, and the common contact 12*g* being sequentially laminated on this vibrating plate 12*a*. Alternatively, the protrusions P1, P2 may be formed by forming the interlayer insulating film 12*i* only in a region facing the protrusions P1, P2, of a region facing the common contact 12*g* on the upper surface of the piezoelectric body protective film 12*h*, and forming the common contact 12*g* on this interlayer insulating film 12*i*.

As mentioned above, due to the present embodiment, the common trace 18*g* has in the adhesion region 18Ag the five terminals 18*g*1 that are separated from each other and the base section 18*g*2 that is coupled to the five terminals 18*g*1 (refer to FIG. 6). In this case, by the adhesive agent A penetrating between the five terminals 18*g*1 (refer to FIG. 7B), adhesive strength of the flow path substrate 11 and the COF 18 improves. Moreover, both the five terminals 18*g*1 and the base section 18*g*2 are adhered to the common contact 12*g*, hence even if variation occurs in contact resistance in the five terminals 18*g*1, it is possible to avoid a situation where a current is dispersed in the base section 18*g*2 and the current concentrates in a terminal 18*g*1 whose contact resistance is small. Therefore, it is possible to achieve both prevention of disconnection of the terminal 18*g*1 and improvement of adhesive strength of the flow path substrate 11 and the COF 18.

The base section 18*g*2 is provided on the downstream side in the lead-out direction with respect to the five terminals 18*g*1 (refer to FIG. 6). In the COF 18, it is easier for a force to be applied due to bending or the like and it is easier for peeling from the flow path substrate 11 to occur on the downstream side in the lead-out direction compared to on an upstream side in the lead-out direction. In this respect, the above-described configuration results in peeling from the flow path substrate 11 of the COF 18 being prevented due to the base section 18*g*2 being provided on the downstream side in the lead-out direction.

The five terminals 18*g*1 are provided most on the upstream side in the lead-out direction in the adhesion region 18Ag (refer to FIG. 6). In this case, the space between the terminals 18*g*1 is not closed but communicates with outside, and it is possible for the adhesive agent A to move to the upstream side in the lead-out direction from the space between the terminals 18*g*1 without staying in the space between the terminals 18*g*1. Therefore, flowability of the adhesive agent A increases and adhesive strength of the flow path substrate 11 and the COF 18 improves even more.

The common contact 12*g* has in the adhesion region 18Ag the protrusions P1, P2 that project in the direction of increasing closeness to the common trace 18*g* (refer to FIGS. 6, 7A and 7B). In this case, the adhesive agent A penetrates into peripheries of the protrusions P1, P2, whereby flowability of the adhesive agent A in the adhesion region 18Ag increases and adhesive strength of the flow path substrate 11 and the COF 18 improves even more.

The protrusions P1 are provided in the positions facing the five terminals 18*g*1 (refer to FIGS. 6 and 7B). In this case, the adhesive agent A penetrates into the periphery of the protrusion P1, whereby flowability of the adhesive agent A in a portion facing the terminal 18*g*1 increases and adhesive strength of the flow path substrate 11 and the COF 18 improves even more.

The protrusion P2 is further provided in the position facing the base section 18*g*2 (refer to FIGS. 6 and 7A). In this case, the adhesive agent A penetrates into the periphery of the protrusion P2, whereby flowability of the adhesive agent A in a portion facing the base section 18*g*2 increases and adhesive strength of the flow path substrate 11 and the COF 18 improves even more.

The protrusion P1 provided in the position facing each of the terminals 18*g*1 and the protrusion P2 provided in the position facing the base section 18*g*2 are separated from each other (refer to FIG. 6). In this case, the adhesive agent A penetrates between the protrusions P1, P2 and flowability of the adhesive agent A increases, whereby adhesive strength of the flow path substrate 11 and the COF 18 improves even more.

The gap 12*gx* is provided in the portion facing the space V between the terminals 18*g*1 in the common contact 12*g* (refer to FIGS. 6 and 7B). In this case, the adhesive agent A is filled into the space V between the terminals 18*g*1 and into the gap 12*gx* corresponding to this space V, whereby adhesive strength of the flow path substrate 11 and the COF 18 improves even more. Moreover, when the adhesive agent A and the common contact 12*g* are configured by materials that adhere to each other with difficulty, it becomes easy for peeling to occur in a portion where the adhesive agent A and the common contact 12*g* make contact between the terminals 18*g*1. In this respect, the above-described configuration makes it possible for peeling to be prevented by providing between the terminals 18*g*1 a portion where the adhesive agent A and the common contact 12*g* do not make contact. For example, the common contact 12*g* may be configured by Au (gold), and the common trace 18*g* may be configured by Au (gold), Cu (copper), Sn (tin), or the like.

The width (a length in a separation direction that the five terminals 18*g*1 are separated from each other) W1 of the five terminals 18*g*1 is longer than the length L1 in the lead-out direction (an extension direction in which each of the terminals 18*g*1 extends) of each of the terminals 18*g*1 (W1>L1; refer to FIG. 6). In this case, a size in the lead-out direction in the flow path substrate 11 can be made smaller.

The length L2 in the lead-out direction of the base section 18*g*2 is shorter than the length L1 in the lead-out direction of each of the terminals 18*g*1 (L1>L2; refer to FIG. 6). If the length in the lead-out direction of the base section 18*g*2 is too long, then flowability of the adhesive agent A in the periphery of the base section 18*g*2 worsens, and adhesive strength in the base section 18*g*2 may deteriorate. In this respect, the above-described configuration makes it possible for the above-described problem to be prevented due to length in the lead-out direction of the base section 18*g*2 being suppressed.

The width (a length in the separation direction that the five terminals 18*g*1 are separated from each other) W2 of the base section 18*g*2 is longer than the width W1 of the five terminals 18*g*1 (W2>W1; refer to FIG. 6). In this case, in the base section 18*g*2, a contact area with the common contact 12*g* increases, and contact resistance between the common contact 12*g* and the common trace 18*g* can be reduced. Consequently, it is possible to more reliably avoid the situation where in the case that variation has occurred in contact resistance in the five terminals 18*g*1, a current dispersion effect due to the base section 18*g*2 increases and the current concentrates in the terminal 18*g*1 whose contact resistance is small.

The adhesion region 18Ag of the common trace 18*g* and the common contact 12*g* has a larger area than the adhesion region 18Af of each of the individual traces 18*f* and each of the individual contacts 12*f* (refer to FIG. 5). A larger current flows in the common contact 12*g* compared to in each of the individual contacts 12*f* at such times as when a plurality of the active sections 12*x* are simultaneously driven, hence from a viewpoint of suppressing voltage drop, it is desirable for contact resistance between the common contact 12g and the common trace 18g to be reduced. In this respect, the above-described configuration makes it possible for contact resistance between the common contact 12g and the common trace 18g to be reduced by area of the adhesion region 18Ag of the common contact 12g and the common trace 18g being increased. Furthermore, the five terminals 18g1 can be efficiently formed utilizing said adhesion region 18Ag of large area.

The separation direction that the five terminals 18g1 are separated from each other in the common trace 18g and the array direction in which the plurality of individual traces 18f are arranged, are the same as each other (refer to FIG. 5). Moreover, the spacing in the separation direction of fellow terminals 18g1 in the common trace 18g and the spacing in the array direction of fellow individual traces 18f, are the same as each other (the spacing D). In this case, formation of each of the traces 18f, 18g becomes easy. When the spacing in the separation direction of the terminals 18g1 in the common trace 18g becomes narrower, flowability of the adhesive agent A decreases at an area near the terminals 18g1. In this case, mobility of the adhesive agent A located between the terminals 18g1 and the common contact 12g becomes lower. Therefore, it becomes difficult to move the adhesive agent to an area peripheral to the terminals 18g1, when a pressure is applied to the adhesive agent A. There is a fear that the terminals 18g1 and the common contact 12g are adhered in a state in which unexpected amount of the adhesive agent A is remained between the terminals 18g1 and the common contact 12g. A large amount of the adhesive agent A remained between the terminals 18g1 and the common contact 12g could lead to a disconnection between the terminals 18g1 and the common contact 12g (so-called open circuit trouble). Note that in the present embodiment, the plurality of individual traces 18f are also provided, and the spacing in the separation direction of the plurality of individual traces 18f is narrowed as much as possible in view of the downsizing of the head 1. However, the spacing in the separation direction of the plurality of individual traces 18f is designed not to occur the above described open circuit trouble. In the present embodiment, as described above, the spacing in the separation direction of the terminals 18g1 in the common trace 18g is designed in a same length as the spacing in the array direction of the individual traces 18f. Therefore, it is possible to avoid the disconnection between the terminals 18g1 and the common contact 12g, and arrange the terminals 18g1 densely.

The COF 18 has the bent section 18v in a portion where the common trace 18g is provided, and the slit S is provided in the common trace 18g of the bent section 18v (refer to FIGS. 4 to 6). In this case, the bent section 18v can be easily formed without damaging the COF 18.

The bent section 18v is provided in the adhesion regions 18Af, 18Ag (in the present embodiment, at downstream ends in the lead-out direction in the adhesion regions 18Af, 18Ag) (refer to FIGS. 4 and 5). In this case, providing the bent section 18v in the adhesion regions 18Af, 18Ag enables space-saving and miniaturization of the head 1 to be achieved.

The adhesive agent A is configured from the anisotropic conductive film. In this case, it becomes particularly easy for variation to occur in contact resistance in the five terminals 18g1. However, in the present embodiment, both the five terminals 18g1 and the base section 18g2 of the common trace 18g are adhered to the common contact 12g, hence even if variation occurs in contact resistance in the five terminals 18g1, it is possible to avoid the situation where the current is dispersed in the base section 18g2 and the current concentrates in the terminal 18g1 whose contact resistance is small.

Second Embodiment

Next, a head 201 according to a second embodiment of the present teaching will be described with reference to FIG. 8.

Figure 8:
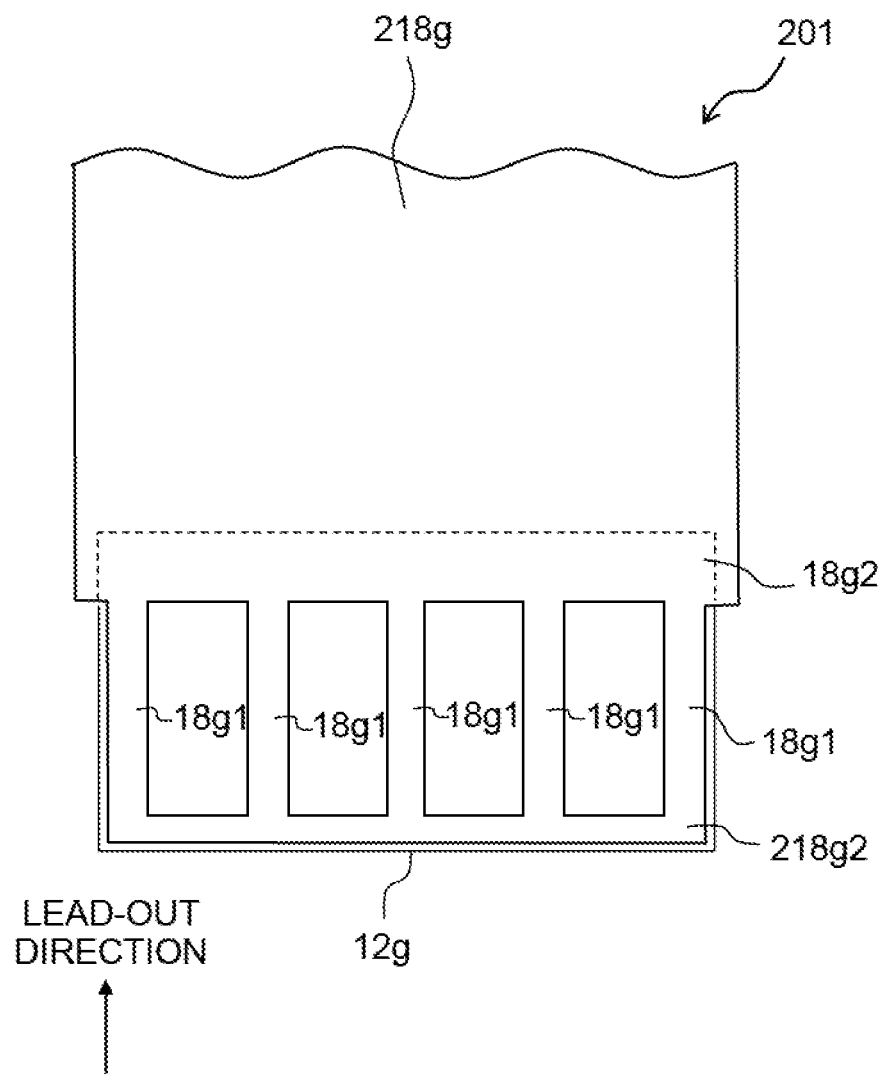
FIG. 8 is a view corresponding to FIG. 6 of a head 201 according to a second embodiment of the present teaching.

Whereas in the first embodiment, as depicted in FIG. 6, the base section 18g2 of the common trace 18g is provided only on the downstream side in the lead-out direction with respect to the five terminals 18g1, in the present embodiment, as depicted in FIG. 8, base sections 18g2, 218g2 of a common trace 218g are respectively provided on the downstream side and the upstream side in the lead-out direction with respect to the five terminals 18g1. In other words, the present embodiment is a configuration in which the base section 218g2 provided on the upstream side in the lead-out direction with respect to the five terminals 18g1 has been added to the common trace 18g of the first embodiment. The base section 218g2 faces and is adhered to an end section on the upstream side in the lead-out direction in the common contact 12g.

Due to the present embodiment, it is possible to increase total area of the base sections 18g2, 218g2 more and to reduce contact resistance between the common contact 12g and the common trace 18g more, compared to when (refer to FIG. 6) the base section 18g2 is provided only on the downstream side in the lead-out direction with respect to the five terminals 18g1. Moreover, it is possible to more reliably avoid the situation where in the case that variation has occurred in contact resistance in the five terminals 18g1, a current dispersion effect due to the base sections 18g2, 218g2 increases and the current concentrates in the terminal 18g1 whose contact resistance is small. It is possible to increase the area of the base section 18g2 instead of providing the base section 218g2. However, when the area of the base section 18g2 increases, the flowability of the adhesive agent A decreases at an area around the base section 18g2. It is possible to enhance the flowability of the adhesive agent A in a case in which the base section 218g2 is provided than a case in which the area of the base section 18g2 is increased.

Third Embodiment

Next, a head 301 according to a third embodiment of the present teaching will be described with reference to FIG. 9.

Figure 9:
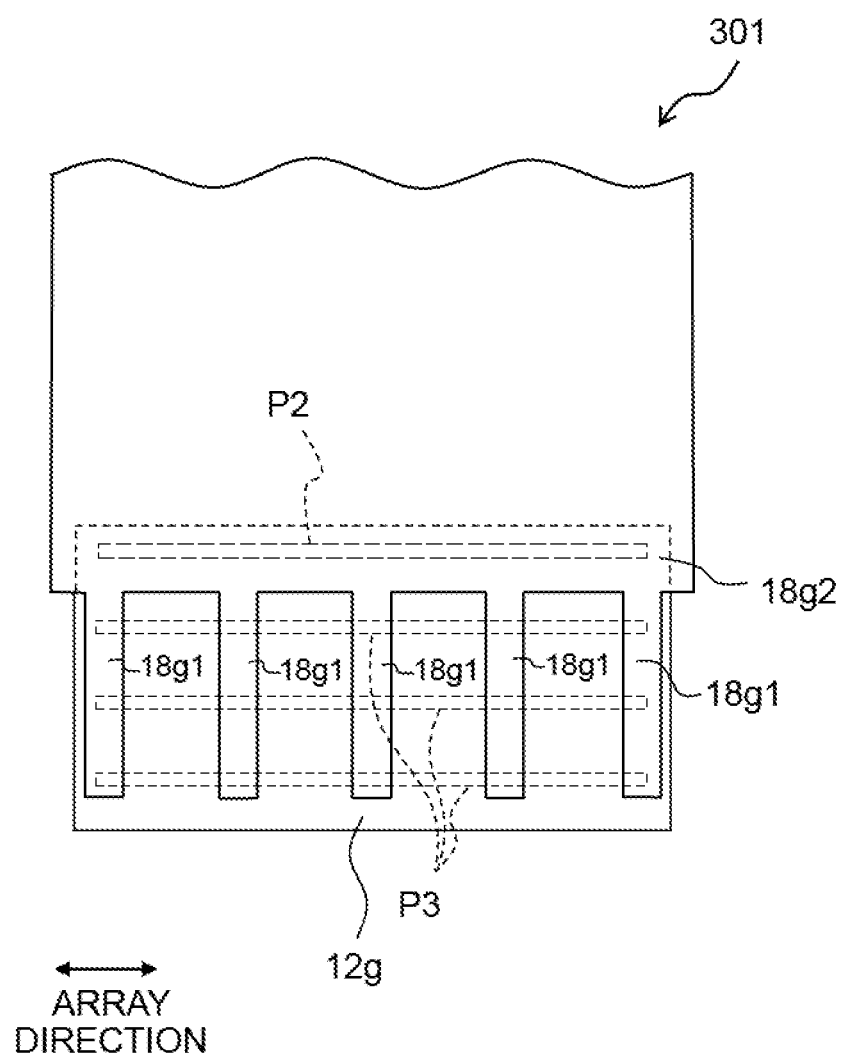
FIG. 9 is a view corresponding to FIG. 6 of a head 301 according to a third embodiment of the present teaching.

Whereas in the first embodiment, as depicted in FIG. 6, the five protrusions P1 provided in the positions facing the terminals 18g1 in the common contact 12g extend along an extension direction of each of the terminals 18g1 (the lead-out direction), in the present embodiment, as depicted in FIG. 9, three protrusions P3 provided in positions facing the terminals 18g1 in the common contact 12g each extend over the five terminals 18g1, along the separation direction that the terminals 18g1 are separated from each other (the array direction). The three protrusions P3 and the protrusion P2 which is provided in the position facing the base section 18g2, are disposed equally spaced in the lead-out direction.

Due to the present embodiment, each of the terminals 18g1 and each of the protrusions P3 resultantly make point contact, the adhesive agent penetrates into peripheries of these point contact portions, and flowability of the adhesive agent increases, whereby adhesive strength of the flow path substrate 11 and the COF 18 improves even more. Moreover, it is easy for the adhesive agent to flow along the separation direction (the array direction) of the terminals 18g1, and strength of end sections in the separation direction (the array direction) in the five terminals 18g1 can be secured.

Fourth Embodiment

Next, a head 401 according to a fourth embodiment of the present teaching will be described with reference to FIG. 10.

Figure 10:
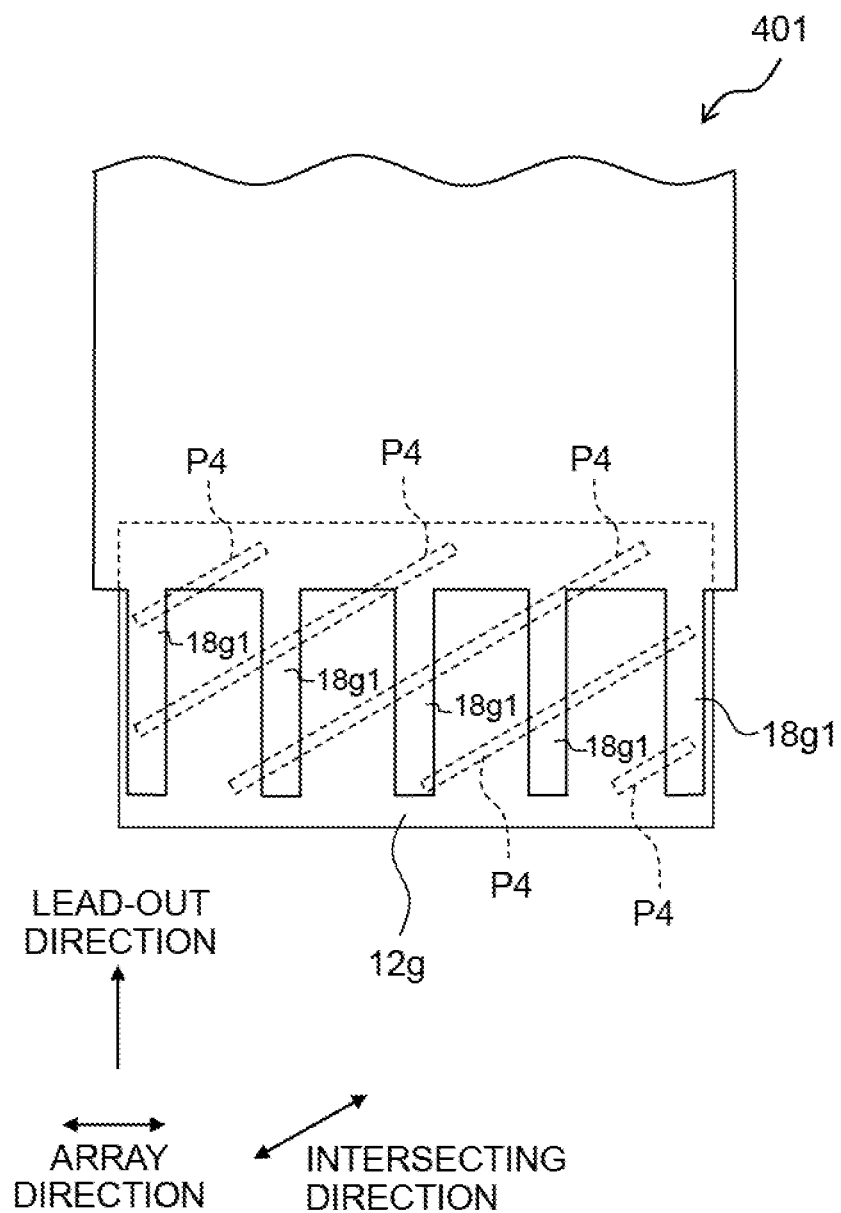
FIG. 10 is a view corresponding to FIG. 6 of a head 401 according to a fourth embodiment of the present teaching.

Whereas in the first embodiment, as depicted in FIG. 6, the protrusions P1, P2 are provided separately in the position facing each of the terminals 18g1 and the position facing the base section 18g2, in the common contact 12g, in the present embodiment, as depicted in FIG. 10, five protrusions P4 each extend along an intersection direction (a direction intersecting both the separation direction that the terminals 18g1 are separated from each other (the array direction) and the extension direction in which each of the terminals 18g1 extends (the lead-out direction)), in an entirety of the common contact 12g. The three protrusions excluding the two protrusions positioned on both outer sides, of the five protrusions P4 extend over a plurality of the terminals 18g1.

Due to the present embodiment, similarly to in the second embodiment, each of the terminals 18g1 and each of the protrusions P4 resultantly make point contact, the adhesive agent penetrates into peripheries of these point contact portions, and flowability of the adhesive agent increases, whereby adhesive strength of the flow path substrate 11 and the COF 18 improves even more. Moreover, it is easy for the adhesive agent to flow along the above-described intersection direction, and strength of end sections in the intersection direction in the five terminals 18g1 can be secured.

Fifth Embodiment

Next, a head 501 according to a fifth embodiment of the present teaching will be described with reference to FIG. 11.

Figure 11:
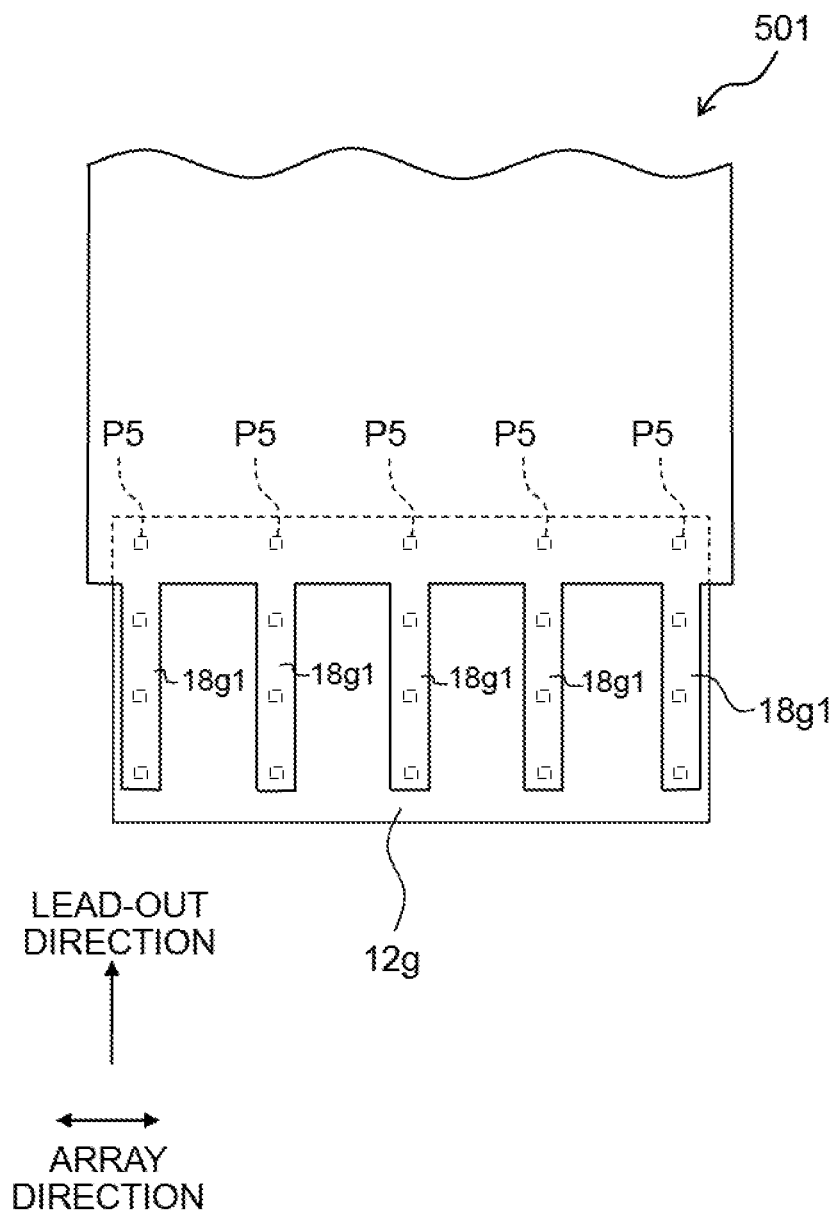
FIG. 11 is a view corresponding to FIG. 6 of a head 501 according to a fifth embodiment of the present teaching.

Whereas in the first embodiment, as depicted in FIG. 6, the protrusions P1, P2 are provided separately in the position facing each of the terminals 18g1 and the position facing the base section 18g2, in the common contact 12g, in the present embodiment, as depicted in FIG. 11, a plurality of protrusions P5 are dotted in a matrix so as to form a plurality of rows lying along the array direction (the separation direction that the terminals 18g1 are separated from each other) and a plurality of columns lying along the lead-out direction (the extension direction in which each of the terminals 18g1 extends), in an entirety of the common contact 12g.

Due to the present embodiment, the protrusions P5 dotted in a matrix are provided, whereby the adhesive agent A resultantly penetrates into a periphery of each of the protrusions P5, flowability of the adhesive agent increases, and adhesive strength of the flow path substrate 11 and the COF 18 improves even more.

Sixth Embodiment

Next, a head 601 according to a sixth embodiment of the present teaching will be described with reference to FIG. 12.

Figure 12:
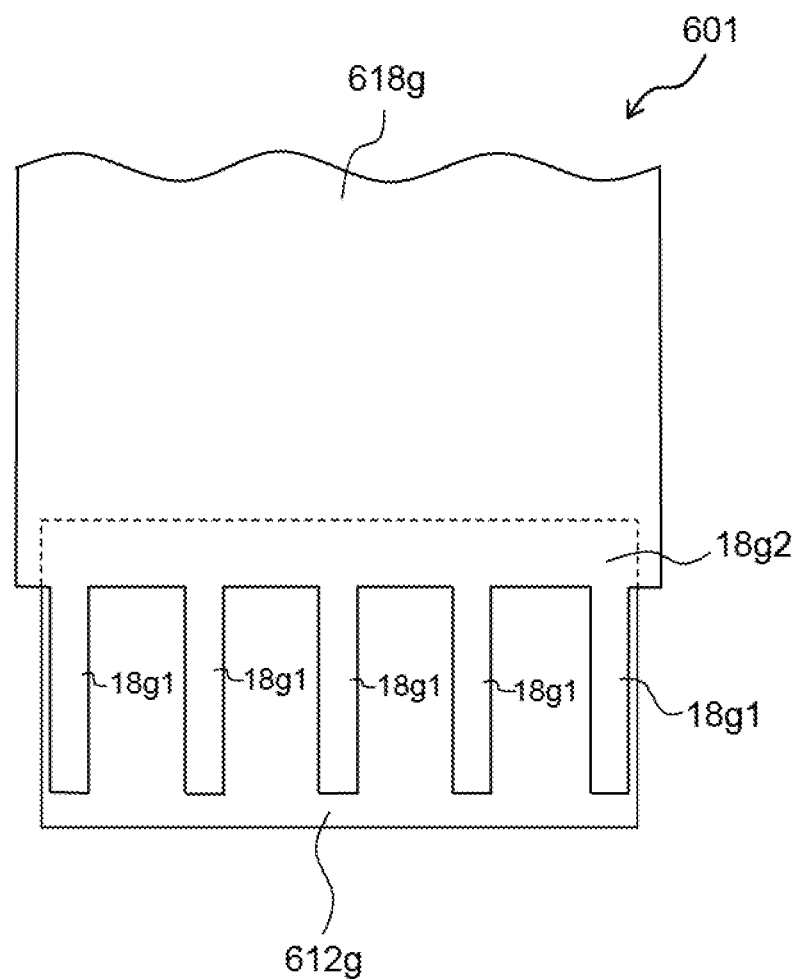
FIG. 12 is a view corresponding to FIG. 6 of a head 601 according to a sixth embodiment of the present teaching.

Whereas in the first embodiment, as depicted in FIG. 6, the protrusions P1, P2 are provided in the position facing each of the terminals 18g1 and the position facing the base section 18g2 in the common contact 12g, in the present embodiment, as depicted in FIG. 12, a protrusion is not provided either in the position facing each of the terminals 18g1 or the position facing the base section 18g2 in a common contact 612g. In this case, contact resistance between the common contact 612g and a common trace 618g can be reduced more compared to when there is a protrusion.

That concludes description of the preferred embodiments of the present teaching. However, the present teaching is not limited to the above-mentioned embodiments, and various design changes are possible within the limits of what is described in the claims.

<Modified Modes>

The adhesive agent is not limited to being configured from an anisotropic conductive film, and may be the likes of an NCF (Non Conductive Film), for example. Moreover, the adhesive agent is not limited to a thermosetting adhesive agent, and may be the likes of an elastomer-based or thermoplastic adhesive agent.

In the above-mentioned embodiments, a plurality of terminals are provided in the common trace. However, a plurality of terminals may be provided in the individual trace. The separation direction of the plurality of terminals is not limited to a direction orthogonal to the lead-out direction, and may be a direction that intersects without being orthogonal to the lead-out direction, or a direction parallel to the lead-out direction. Moreover, a relationship of the width of the plurality of terminals and the length of each of the terminals, a relationship of the length of the base section and the length of each of the terminals, and a relationship of the width of the base section and the width of the plurality of terminals, may be changed arbitrarily.

The protrusion may be provided in only the position facing the plurality of terminals, and not provided in the position facing the base section. The protrusion provided in the position facing the terminal and the protrusion provided in the position facing the base section may be linked and not separated from each other. The protrusion may be omitted (refer to FIG. 12). A number of the protrusions (the protrusions P1 to P5) may be changed arbitrarily, and the positions of the protrusions may be set arbitrarily. Further, at least one of the protrusions may be formed in the individual traces, in the same way as the common traces as described above.

The gap need not have a size and shape matching those of the space between the terminals. The gap may be omitted (for example, the contact may be provided over an entire rectangular shaped region).

The shape and size of the slit, and the number of slits may be changed arbitrarily. Moreover, in the above-mentioned embodiments, the slit is provided in only the common trace. However, the slit may be provided in the individual trace.

The bent section of the trace-substrate may be located outside the adhesion region. Moreover, the slit need not be provided in the trace of the bent section.

The head is not limited to a line type, and may be a serial type. The present teaching is not limited to a printer, and may be applied also to the likes of a facsimile machine, a copy machine, and a multifunction machine. Moreover, the present teaching is not limited to an ink-jet type head, and may be applied to any actuator device (for example, a liquid crystal panel, and so on).

What is claimed is:

1. An actuator device comprising:
   a first substrate including a surface on which a contact is arranged; and
   a second substrate including a trace electrically connected to the contact;
   wherein a portion of the second substrate is laminated to the surface of the first substrate in a first direction,
   wherein the portion of the second substrate is adhered to the surface of the first substrate, wherein a portion of the trace overlaps the contact in the first direction, wherein a portion of the trace includes a plurality of terminals and a base section, wherein the plurality of terminals are separated from each other, and wherein the base section is coupled to the plurality of terminals.

2. The actuator device according to claim 1, wherein the second substrate includes a first end and a second end, the second substrate extending from the first end to the second end in a second direction, the first end being nearer to the portion of the second substrate than the second end of the second substrate in the second direction, the plurality of terminals are separated from each other in a third direction intersecting the second direction, and the base section is located between the plurality of terminals and the second end of the second substrate in the second direction.

3. The actuator device according to claim 2, wherein the plurality of terminals are located in an area of the portion of the second substrate, the area being nearest, in the second direction, to the first end of the second substrate in the portion of the second substrate.

4. The actuator device according to claim 2, further comprising another base section located between the first end of the second substrate and the plurality of terminals in the second direction.

5. The actuator device according to claim 1, wherein the contact includes a protrusion protruding toward the trace in the first direction.

6. The actuator device according to claim 5, wherein the protrusion faces the plurality of terminals in the first direction.

7. The actuator device according to claim 6, further comprising another protrusion protruding toward the trace in the first direction and facing the base section in the first direction.

8. The actuator device according to claim 7, wherein the protrusion facing the plurality of terminals and the another protrusion facing the base section are separated from each other.

9. The actuator device according to claim 1, wherein the contact includes a plurality of protrusions each protruding toward the trace in the first direction, and wherein each of the plurality of protrusions extends across the plurality of terminals such that each of the plurality of protrusions faces the plurality of terminals in the first direction.

10. The actuator device according to claim 1, wherein the contact includes a plurality of protrusions each protruding toward the trace in the first direction, wherein each of the plurality of protrusions faces the plurality of terminals in the first direction, and wherein each of the plurality of protrusions extends, across the plurality of terminals, in a direction intersecting both a separation direction in which the plurality of terminals are separated from each other and an extending direction in which each of the plurality of terminals extends.

11. The actuator device according to claim 1, wherein the contact includes a plurality of protrusions each protruding toward the trace in the first direction, wherein each of the plurality of protrusions faces the plurality of terminals in the first direction, and wherein the plurality of protrusions are positioned in a matrix so as to form a plurality of rows lying along a separation direction in which the plurality of terminals are separated from each other and a plurality of columns lying along an extending direction in which each of the plurality of terminals extends.

12. The actuator device according to claim 1, wherein a gap is provided in a portion, of the contact, facing a space between the plurality of terminals, and wherein the adhesive agent is filled into the space and the gap.

13. The actuator device according to claim 1, wherein a length, of the plurality of terminals, in a separation direction in which the plurality of terminals are separated from each other is longer than a length, of the plurality of terminals, in an extending direction in which each of the plurality of terminals extends.

14. The actuator device according to claim 1, wherein a length, of the base section, in an extending direction in which each of the plurality of terminals extends is shorter than a length, of the plurality of terminals, in the extending direction.

15. The actuator device according to claim 1, wherein a length, of the base section, in a separation direction in which the plurality of terminals are separated from each other is longer than a length, of the plurality of terminals, in the separation direction.

16. The actuator device according to claim 1, wherein the first substrate further includes a plurality of individual contacts, wherein the second substrate further includes a plurality of individual traces electrically connected to the plurality of individual contacts, respectively, and an area, of the second substrate, at which the contact and the trace are adhered is larger than an area, of the second substrate, at which one of the plurality of individual contacts and one of the individual traces are adhered.

17. The actuator device according to claim 16, wherein a separation direction in which the plurality of terminals are separated from each other in the trace is parallel to an array direction in which the plurality of individual traces are arranged, and a spacing distance, in the separation direction, of the plurality of terminals in the trace is same as a spacing distance, in the array direction, of the plurality of individual traces.

18. The actuator device according to claim 1, wherein the second substrate includes a bent section being bent, the bent section being located at a portion of the second substrate at which the trace is provided, and a slit is provided in the trace of the bent section.

19. The actuator device according to claim 18, wherein the bent section is located in the portion of the second substrate at which the first substrate is adhered.

20. The actuator device according to claim 1, further comprising an adhesive agent adhering the first substrate and the second substrate, wherein the adhesive agent is an anisotropic conductive film.

* * * * *